United States Patent
Yamamoto

(10) Patent No.: US 8,610,214 B2
(45) Date of Patent: Dec. 17, 2013

(54) ESD PROTECTION DEVICE HAVING A GEOMETRIC SALICIDE PATTERN

(75) Inventor: Sukehiro Yamamoto, Chiba (JP)

(73) Assignee: Seiko Instruments Inc., Chiba (JP)

( * ) Notice: Subject to any disclaimer, the term of this patent is extended or adjusted under 35 U.S.C. 154(b) by 84 days.

(21) Appl. No.: 13/070,170

(22) Filed: Mar. 23, 2011

(65) Prior Publication Data
US 2011/0233677 A1    Sep. 29, 2011

(30) Foreign Application Priority Data

Mar. 29, 2010  (JP) .................................. 2010-076373

(51) Int. Cl.
  *H01L 23/62* (2006.01)
(52) U.S. Cl.
  USPC ........... 257/355; 257/293; 257/406; 257/277; 257/E27.06
(58) Field of Classification Search
  USPC ..................... 257/355, E27.06, 293, 406, 207
  See application file for complete search history.

(56) References Cited

U.S. PATENT DOCUMENTS

| 2002/0142540 A1* | 10/2002 | Katayama ...................... 438/239 |
| 2003/0052367 A1* | 3/2003 | Lin .............................. 257/355 |
| 2007/0090414 A1* | 4/2007 | Sutou et al. ................... 257/277 |

FOREIGN PATENT DOCUMENTS

JP    2007-116049 A    5/2007

* cited by examiner

*Primary Examiner* — Eugene Lee
*Assistant Examiner* — Elias M Ullah
(74) *Attorney, Agent, or Firm* — Brinks Gilson & Lione

(57) ABSTRACT

Provided is a semiconductor device having an ESD protection MOS transistor including a plurality of transistors combined together, in which a plurality of drain regions and a plurality of source regions disposed alternately and a gate electrode disposed between each pair of adjacent regions constituted of one of the plurality of drain regions and one of the plurality of source regions, in which a distance between a salicide metal region, which is formed on each of the plurality of drain regions, and the gate electrode is determined according to contact holes in the plurality of drain regions and a distance of the contact holes from substrate contacts.

8 Claims, 5 Drawing Sheets

ESD PROTECTION DEVICE HAVING A GEOMETRIC SALICIDE PATTERN

RELATED APPLICATIONS

This application claims priority under 35 U.S.C. §119 to Japanese Patent Application No. 2010-076373 filed on Mar. 29, 2010, the entire content of which is hereby incorporated by reference.

BACKGROUND OF THE INVENTION

1. Field of the Invention

The present invention relates to a semiconductor device that uses a multi-finger (comb-shaped) metal oxide semiconductor (MOS) transistor as an electrostatic discharge (ESD) protection element.

2. Description of the Related Art

In semiconductor devices including MOS transistors, it is a known practice to install an "off" transistor as an ESD protection element for preventing breakdown of an internal circuit due to static electricity from a terminal for an external connection (PAD). The "off" transistor is an N-MOS transistor that is kept in an off state by fixing the electric potential of the gate to the ground level (Vss).

The off transistor is formed of a transistor having a wide gate width of about several hundreds of microns because, unlike other MOS transistors that constitute internal circuits such as a logic circuit, the off transistor is required to allow a large amount of current generated by static electricity to flow instantaneously.

A common way for the off transistor to reduce the occupation area is to adopt a multi-finger type form in which a plurality of drain regions, a plurality of source regions, and a plurality of gate electrodes are combined in a comb-shaped pattern.

However, the structure which is a combination of a plurality of transistors makes it difficult to ensure that all parts of the ESD protection MOS transistor operate uniformly, which can lead to a concentration of current in, for example, a place at a short distance from the external connection terminal, or a place where the sum of wiring resistance and resistance between wiring lines is small. The concentration of current causes a local concentration of stress, which in turn triggers a breakdown, without giving the ESD protection MOS transistor a chance to fully exert its intended ESD protection function.

An improvement for this has been proposed in which uniform operation among transistors is accomplished by varying an aspect of the transistors depending on the distance from the external connection terminal or from substrate contacts, specifically, by making salicide blocks in drain regions which prevent silicidation progressively longer as the distance from the substrate contacts increases (see JP 2007-116049 A, for example).

However, reducing the gate width in an attempt to, for example, ensure uniform operation throughout the off transistor renders the off transistor incapable of implementing its protection function satisfactorily. JP 2007-116049 A aims to adjust the transistor operation speed locally by adjusting the distance from the salicide block in a drain region which prevents silicidation to a gate electrode in accordance with the distance from the substrate contacts, and thus controlling the length of a high resistance region. A problem of JP 2007-116049 A, which is characterized by making the salicide block length progressively shorter as the distance to the substrate contacts decreases, is that, in a part close to the external connection terminal, the off transistor has a small resistance between a gate electrode and salicide metal in a drain region due to its salicide block length, and consequently fails to operate over the entire gate electrode width of the off transistor, which causes a one-point-concentrated breakdown in the part close to the external connection terminal.

The failure to operate over the entire gate electrode width of the off transistor has become particularly problematic in recent years, where the development of wiring containing high-melting point metal and the resultant lowering of wiring resistance have brought about a further increase in surge propagation speed which, contrary to expectations, causes a surge to concentrate on salicide regions in some of drain regions. In the case where the salicide blocks in drain regions are at a constant distance from gate electrodes, too, there is a problem in that an overconcentrated breakdown occurs in a part of an area between a gate electrode and a drain that is close to the external connection terminal. FIG. 5 is a micrograph in which a breakdown point in an off transistor is identified after a breakdown due to the application of an ESD surge. An area surrounded by a circle in FIG. 5 indicates the point where the breakdown has occurred due to the application of the surge. As shown in FIG. 5, the off transistor suffered a local breakdown in a part of an area between a gate electrode and a drain that is close to the external connection terminal.

SUMMARY OF THE INVENTION

To solve those problems, the present invention structures a semiconductor device as follows.

In a semiconductor device according to one aspect of the present invention, the semiconductor device includes an ESD protection N-MOS transistor including a plurality of transistors in a unitary manner, the ESD protection N-MOS transistor including a plurality of drain regions and a plurality of source regions disposed alternately and a gate electrode disposed between each pair of adjacent regions constituted of one of the plurality of drain regions and one of the plurality of source regions, in which the plurality of drain regions are electrically connected to an external connection terminal, the plurality of source regions are electrically connected to a ground electric potential supplying line, and each of the plurality of drain regions is provided with a salicide block formed to have a length that decreases as the distance from substrate contacts increases and that is determined by the ratio of the maximum distance from the gate electrode and the number of contact holes.

Further, in a semiconductor device according to another aspect of the present invention, each of the plurality of drain regions is provided with a salicide block formed to have a length that increases as the distance from the external connection terminal increases.

In the case where two or more rows of contact holes are provided in each of the plurality of drain regions, each contact hole is kept at a constant distance from the salicide block.

As described above, according to the present invention which uses those measures, an ESD protection MOS transistor can operate uniformly throughout its multi-finger structure even when high-speed, multi-layer wiring containing high melting-point metal is used and an ESD surge is consequently introduced into this off transistor from a direction perpendicular to a channel width direction of the off transistor.

A semiconductor device including an ESD protection MOS transistor having a satisfactory ESD protection function is thus obtained.

DETAILED DESCRIPTION OF THE PREFERRED EMBODIMENTS

A plurality of embodiments is described below with reference to the drawings to show modes of carrying out the present invention.

First Embodiment

Figure 1:
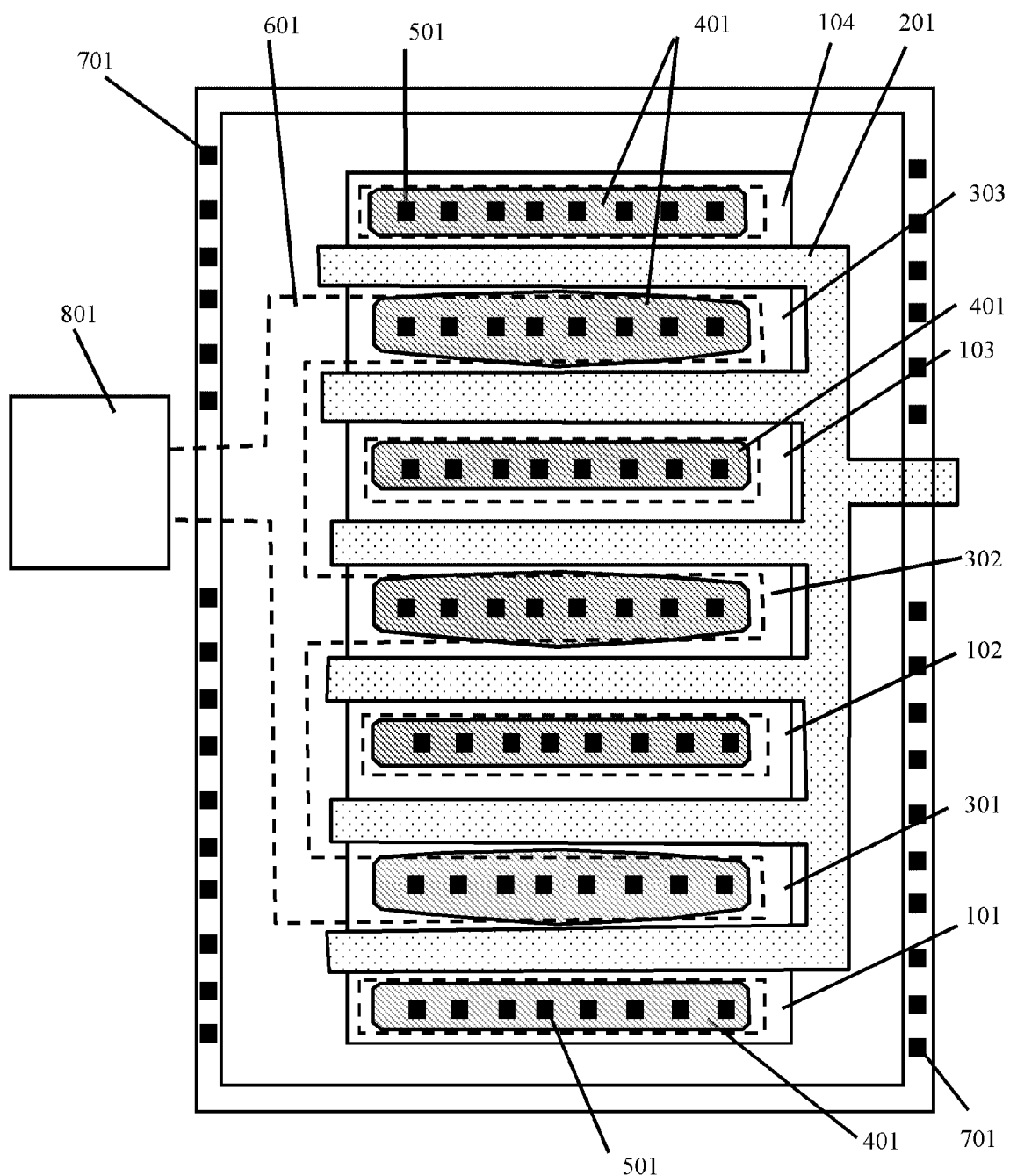
FIG. 1 is a schematic plan view illustrating an ESD protection MOS transistor of a semiconductor device according to a first embodiment of the present invention.

FIG. 1 is a schematic plan view illustrating an ESD protection MOS transistor of a semiconductor device according to a first embodiment of the present invention.

A first source region 101 and a first drain region 301 are formed from heavily-doped impurity regions. A gate insulating film (not shown) is formed between the first source region 101 and the first drain region 301 from a silicon oxide film or the like, and a gate electrode 201 is formed from polysilicon or the like on top of the gate insulating film. The rest is in a repetitive pattern: a second source region 102 is formed next to the first drain region 301 with another gate electrode 201 interposed therebetween; a second drain region 302 is formed next to the second source region 102 with still another gate electrode 201 interposed therebetween; a third source region 103 is formed next to the second drain region 302 with yet still another gate electrode 201 interposed therebetween; a third drain region 303 is formed next to the third source region 103 with yet still another gate electrode 201 interposed therebetween, and a fourth source region 104 is formed next to the third drain region 303 with yet still another gate electrode 201 interposed therebetween. In each drain region and each source region, a salicide metal region 401 is formed from a salicide block for preventing salicidation, at a constant distance from the interposed gate electrode 201.

This embodiment deals with an example in which four source regions, three drain regions, and six gate electrodes are arranged in combination as six MOS transistors which together form a comb-shaped pattern.

Metal line is used to supply a ground electric potential to the first source region 101, the second source region 102, the third source region 103, and the fourth source region 104 though omitted from the drawing for the sake of simplification. The metal line is connected to a ground electric potential supplying line, which is wide, low-resistant wiring lines made from, for example, a metal material that contains high-melting point metal. The metal line, too, is formed from a material that contains high-melting point metal or from a similar material. The metal line is wired from the ground electric potential supply line in a direction perpendicular to a channel width direction of the ESD protection MOS transistor and, through not shown in the drawing, connected through via holes or the like to another metal line formed from a material that contains high-melting point metal or from a similar material, and connected through contact holes 501 to the first source region 101, the second source region 102, the third source region 103, and the fourth source region 104.

A first metal line 601 formed from a material that contains high-melting point metal or from a similar material is connected to an external connection terminal 801 to introduce an external input to the first drain region 301, the second drain region 302, and the third drain region 303. The first metal line 601 is connected to the first drain region 301, the second drain region 302, and the third drain region 303 through the contact holes 501.

In the first embodiment illustrated in FIG. 1, the salicide blocks are formed in the drain regions of the ESD protection MOS transistor such that the distance from the gate electrodes 201 decreases as the distance from substrate contacts 701 increases. In other words, the distance between the gate electrodes 201 and salicide metal regions 401 is made short around the middle of the gate electrodes 201.

For example, in the case of the first embodiment where one row of contact holes 501 is provided in each drain region for the sake of simplifying the description, the distance of the salicide block in each drain region is set such that a salicide block edge between one of the contact holes 501 in the drain region that is closest to the substrate contacts 701 and the adjacent gate electrode 201 is at a distance of 10 μm from the gate electrode 201, whereas a salicide block edge between the tenth contact hole 501 counted from the substrate contacts 701 and the adjacent gate electrode 201 is set to a distance of 9 μm from the gate electrode 201, to thereby create a resistance difference (calculation example: distance=[10−(number of contact holes counted from substrate contacts/10)]). Similarly, an edge of the salicide block between the twentieth contact hole 501 and the adjacent gate electrode 201 is set to a distance of 8 μm from the gate electrode 201. How the distance of the salicide blocks in the drain regions is set is not limited to this example, and the distance can be set freely in a manner that allows a semiconductor element used to exhibit its ESD characteristics to the fullest.

Second Embodiment

Figure 2:
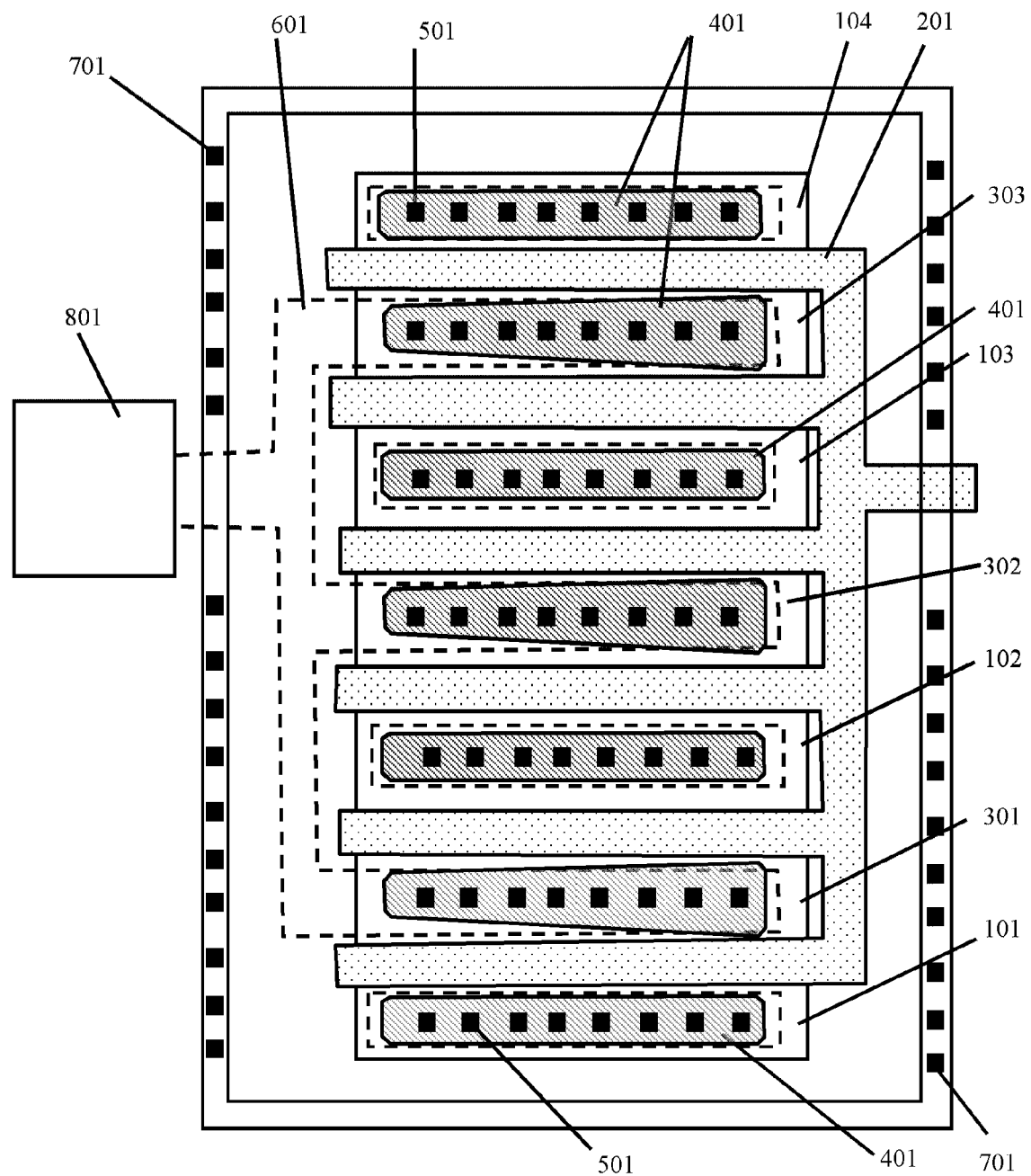
FIG. 2 is a schematic plan view illustrating an ESD protection MOS transistor of a semiconductor device according to a second embodiment of the present invention.

FIG. 2 is a schematic plan view illustrating an ESD protection MOS transistor of a semiconductor device according to a second embodiment of the present invention. Components in FIG. 2 that correspond to those in FIG. 1 are denoted by the same reference numbers in order to omit a description on what has already been described.

A difference from the first embodiment illustrated in FIG. 1 is how the distance of the salicide blocks provided in drain regions to prevent salicidation is set. In the first embodiment illustrated in FIG. 1, the distance from the substrate contacts 701 determines the way the salicide blocks are set up. The salicide blocks of the first embodiment are formed such that a salicide block edge between the contact hole 501 that is close to the substrate contacts 701 and the adjacent gate electrode 201 is at a long distance from the gate electrode 201, whereas a salicide block edge between the contact hole 501 that is farthest from the substrate contacts 701 and the adjacent gate electrode 201 is at a short distance from the gate electrode 201.

The second embodiment illustrated in FIG. 2, on the other hand, uses the distance from the external connection terminal 801 to determine the way the salicide blocks are set up. The salicide blocks of the second embodiment are formed such that a salicide block edge between the contact hole 501 that is close to the external connection terminal 801 and the adjacent gate electrode 201 is at a long distance from the gate electrode 201, whereas a salicide block edge between the contact hole 501 that is farthest from the external connection terminal 801 and the adjacent gate electrode 201 is at a short distance from the gate electrode 201. In other words, the salicide blocks are arranged such that the resistance between the contact holes 501 and the gate electrodes 201 is raised as the distance to the external connection terminal 801 decreases, whereas the resistance between the contact holes 501 and the gate electrodes 201 is lowered as the distance from the external connection terminal 801 increases. This enables the off transistor to operate over the entire gate electrode width when an ESD surge is applied.

Third Embodiment

Figure 3:
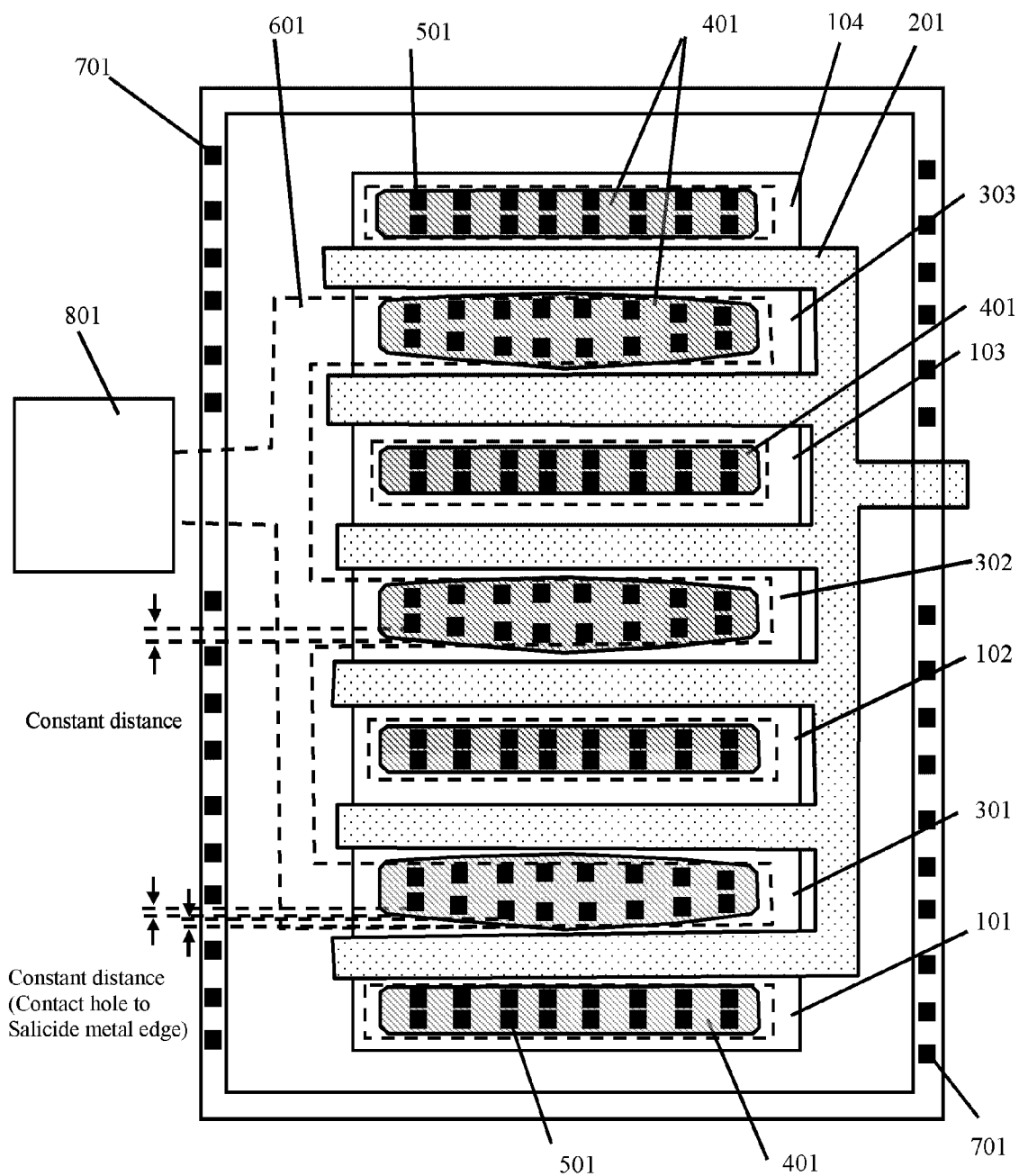
FIG. 3 is a schematic plan view illustrating an ESD protection MOS transistor of a semiconductor device according to a third embodiment of the present invention.

FIG. 3 is a schematic plan view illustrating an ESD protection MOS transistor of a semiconductor device according to a third embodiment of the present invention. The third embodiment shares some points with the first embodiment, and descriptions on the common points are omitted here to focus on differences.

The third embodiment differs from the first embodiment illustrated in FIG. 1 in that a plurality of rows of contact holes 501 are provided, and in how the contact holes 501 are arranged. In the first embodiment where one row of contact holes 501 is provided in each drain region, the distance between the contact holes 501 and edges of salicide blocks for preventing salicidation is not fixed, and the contact holes 501 are aligned in the center of their drain region. The contact holes 501 in the third embodiment are arranged such that each contact hole 501 in the plurality of rows of contact holes 501 is at a constant distance from the nearest edge of the salicide metal region 401.

The fixed distance may be set freely in a manner that allows a semiconductor element used to exhibit its ESD characteristics to the fullest.

Fourth Embodiment

Figure 4:
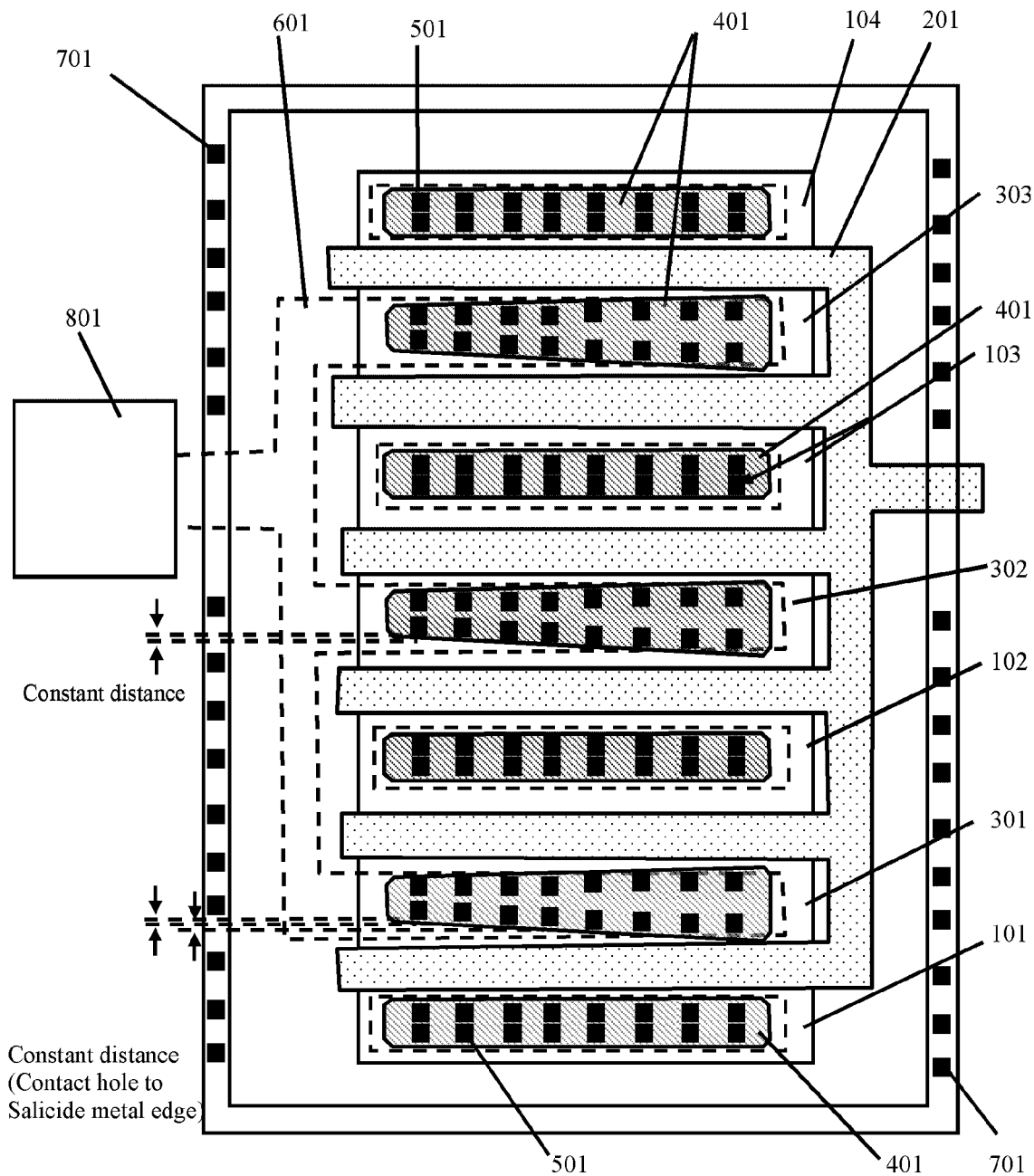
FIG. 4 is a schematic plan view illustrating an ESD protection MOS transistor of a semiconductor device according to a fourth embodiment of the present invention.
Figure 5:
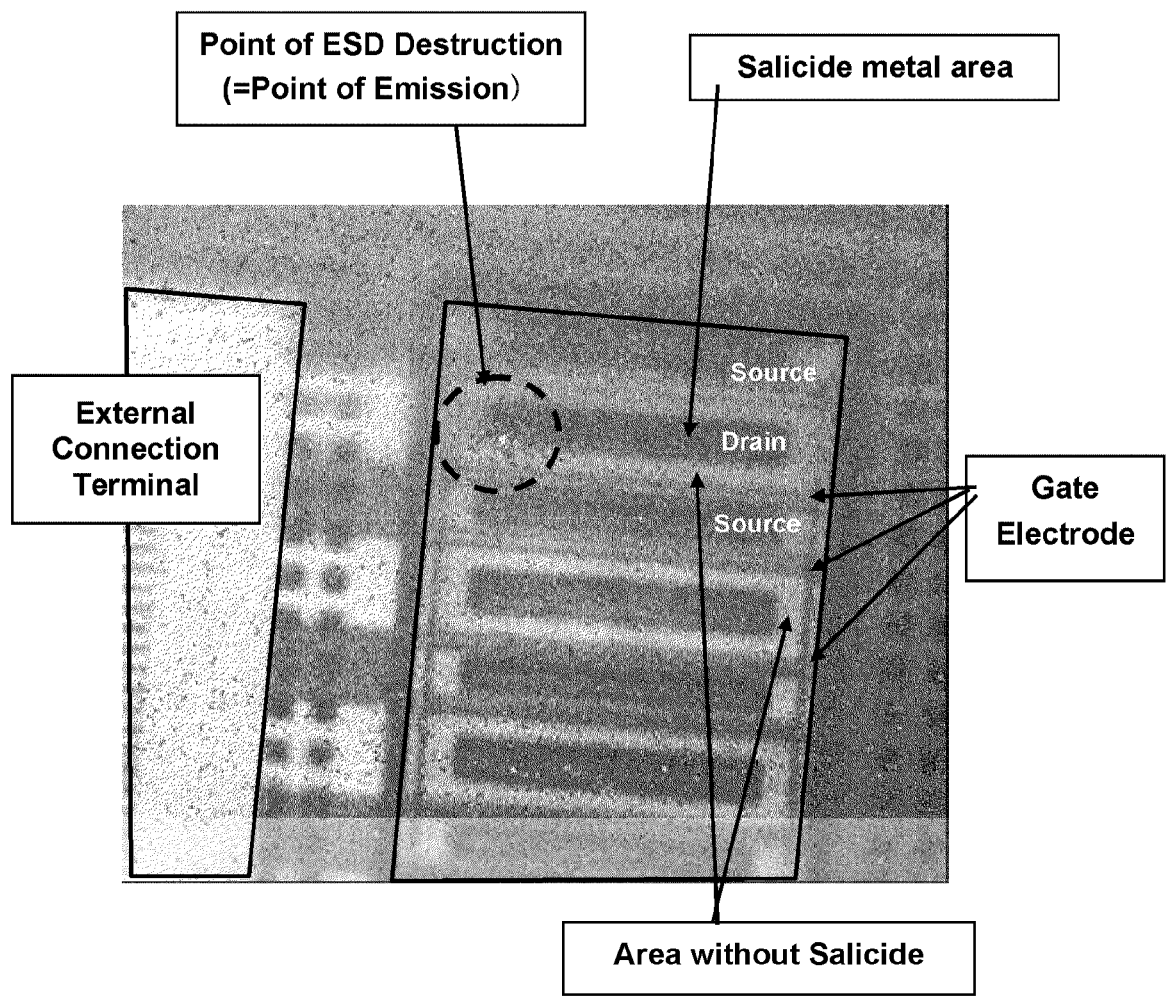
FIG. 5 is a micrograph in which a breakdown point is identified after application of an ESD surge to a conventional ESD protection MOS transistor.

FIG. 4 is a schematic plan view illustrating an ESD protection MOS transistor of a semiconductor device according to a fourth embodiment of the present invention. For the sake of simplifying the description, this embodiment takes as an example an off transistor that has two rows of contact holes. The fourth embodiment shares some points with the second embodiment, and descriptions on the common points are omitted here to focus on differences. The fourth embodiment differs from the second embodiment illustrated in FIG. 2 in that a plurality of rows of contact holes 501 are provided, and in how the contact holes 501 are arranged.

In the second embodiment where one row of contact holes 501 is provided in each drain region, the distance between the contact holes 501 and edges of salicide blocks for preventing salicidation is not fixed, and the contact holes 501 are aligned in the center of their drain region. The contact holes 501 in the fourth embodiment are arranged such that each contact hole 501 in the plurality of rows of contact holes 501 is at a constant distance from the nearest edge of the salicide metal region 401.

The fixed distance may be set freely in a manner that allows the selected semiconductor element to exhibit its maximal ESD characteristics.

What is claimed is:

1. A semiconductor device, comprising an ESD protection MOS transistor in a substrate and spaced apart from substrate contacts, the ESD protection MOS transistor comprising:
 a plurality of drain regions and a plurality of source regions disposed alternately; and
 a gate electrode disposed between each pair of adjacent regions constituted of one of the plurality of drain regions and one of the plurality of source regions, thereby constitutes a unified structure;
 wherein the plurality of drain regions are electrically connected to an external connection terminal,
 wherein the plurality of source regions are electrically connected to a ground electric potential supplying line, and
 wherein each of the plurality of drain regions is provided with a salicide metal pattern on a surface of the substrate, such that a distance along the surface of the substrate between an edge of the salicide metal pattern and the gate electrode and a corresponding transistor resistance between a nearest contact hole and the gate electrode steadily decreases as a distance along the surface of the substrate from the salicide metal pattern to the substrate contacts of the ESD protection MOS transistor increases.

2. The semiconductor device according to claim 1, wherein, when each of the plurality of drain regions comprises a plurality of rows of contact holes, each contact hole is kept at a constant distance from a nearest edge of the salicide metal.

3. The semiconductor device according to claim 1, wherein the salicide metal pattern contains one of Ti and Co.

4. The semiconductor device according to claim 1, wherein the substrate contacts comprise a linear pattern surrounding the ESD protection MOS transistor.

5. A semiconductor device, comprising an ESD protection MOS transistor in a substrate, the ESD protection MOS transistor comprising:
 a plurality of drain regions and a plurality of source regions disposed alternately; and
 a gate electrode disposed between each pair of adjacent regions constituted of one of the plurality of drain regions and one of the plurality of source regions, thereby constitutes a unified structure;
 wherein the plurality of drain regions are electrically connected to an external connection terminal,
 wherein the plurality of source regions are electrically connected to a ground electric potential supplying line, and
 wherein each of the plurality of drain regions is provided with a salicide metal pattern on a surface of the substrate, such that a distance along the surface of the substrate between an edge of the salicide metal pattern and the gate electrode and a corresponding transistor resistance between a nearest contact hole and the gate electrode steadily decreases as a distance along the surface of the substrate between the external connection terminal and the ESD protection MOS transistor increases.

6. The semiconductor device according to claim 5, wherein, when each of the plurality of drain regions comprises a plurality of rows of contact holes, each contact hole is kept at a constant distance from a nearest edge of the salicide metal pattern.

7. The semiconductor device according to claim 5, wherein the salicide metal pattern contains one of Ti and Co.

8. The semiconductor device according to claim 5 further comprising substrate contacts in a linear pattern surrounding the ESD protection MOS transistor, and wherein the substrate contacts reside between the external connection terminal and ESD protection MOS transistor along the substrate surface.

* * * * *